United States Patent
Hsieh et al.

(10) Patent No.: US 12,353,120 B2
(45) Date of Patent: Jul. 8, 2025

(54) EUV PHOTO MASKS AND MANUFACTURING METHOD THEREOF

(71) Applicant: TAIWAN SEMICONDUCTOR MANUFACTURING COMPANY, LTD., Hsinchu (TW)

(72) Inventors: Wei-Che Hsieh, Taipei (TW); Chi-Lun Lu, Hsinchu (TW); Ping-Hsun Lin, New Taipei (TW); Fu-Sheng Chu, Zhubei (TW); Ta-Cheng Lien, Cyonglin Township (TW); Hsin-Chang Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 176 days.

(21) Appl. No.: 17/390,298

(22) Filed: Jul. 30, 2021

(65) Prior Publication Data
US 2023/0032950 A1    Feb. 2, 2023

(51) Int. Cl.
*G03F 1/24* (2012.01)
*G03F 1/54* (2012.01)
*G03F 7/16* (2006.01)
*G03F 7/40* (2006.01)

(52) U.S. Cl.
CPC .............. *G03F 1/24* (2013.01); *G03F 1/54* (2013.01); *G03F 7/162* (2013.01); *G03F 7/40* (2013.01)

(58) Field of Classification Search
CPC ..... G03F 1/22; G03F 1/24; G03F 7/22; G03F 7/24
See application file for complete search history.

(56) References Cited

U.S. PATENT DOCUMENTS

| | | | |
|---|---|---|---|
| 5,641,593 A * | 6/1997 | Watanabe | G03F 7/2039 430/394 |
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,310,675 B2 | 4/2016 | Huang et al. | |
| 9,529,268 B2 | 12/2016 | Chang et al. | |
| 9,548,303 B2 | 1/2017 | Lee et al. | |
| 9,588,419 B2 | 3/2017 | Lu et al. | |
| 9,618,837 B2 | 4/2017 | Lu et al. | |
| 9,869,928 B2 | 1/2018 | Huang et al. | |
| 9,869,934 B2 | 1/2018 | Huang et al. | |

(Continued)

FOREIGN PATENT DOCUMENTS

| | | | | |
|---|---|---|---|---|
| CN | 1695093 A | * | 11/2005 | ............. B82Y 10/00 |
| JP | 2005268750 A | * | 9/2005 | ............... G03F 1/24 |

(Continued)

*Primary Examiner* — Martin J Angebranndt
(74) *Attorney, Agent, or Firm* — STUDEBAKER BRACKETT PLLC

(57) ABSTRACT

A reflective mask includes a substrate, a lower reflective multilayer disposed over the substrate, an intermediate layer disposed over the lower reflective multilayer, an upper reflective multilayer disposed over the intermediate layer, a capping layer disposed over the upper reflective multilayer, and an absorber layer disposed in a trench formed in the upper reflective layers and over the intermediate layer. The intermediate layer includes a metal other than Cr, Ru, Si, Si compound and carbon.

20 Claims, 13 Drawing Sheets

(56) References Cited

U.S. PATENT DOCUMENTS

| | | | |
|---|---|---|---|
| 9,869,939 B2 | 1/2018 | Yu et al. | |
| 2002/0045108 A1* | 4/2002 | Lee | G03F 1/38 430/5 |
| 2003/0039894 A1* | 2/2003 | Yan | G03F 1/24 430/323 |
| 2004/0091789 A1* | 5/2004 | Han | B82Y 10/00 430/311 |
| 2005/0084768 A1* | 4/2005 | Han | G21K 1/062 430/323 |
| 2008/0176150 A1* | 7/2008 | Saito | G03F 1/26 430/311 |
| 2009/0305147 A1* | 12/2009 | Constancias | G03F 1/32 430/5 |
| 2012/0045712 A1* | 2/2012 | Chang | G03F 1/24 430/5 |
| 2013/0164660 A1* | 6/2013 | Hayashi | G03F 1/54 430/5 |
| 2013/0280643 A1* | 10/2013 | Hsu | H01L 21/0337 430/5 |
| 2014/0272681 A1* | 9/2014 | Huang | G03F 1/22 430/5 |
| 2014/0370424 A1* | 12/2014 | Onoue | B82Y 40/00 430/5 |
| 2015/0024305 A1* | 1/2015 | Lu | G03F 1/52 430/5 |
| 2015/0261082 A1* | 9/2015 | Shih | G03F 7/20 430/5 |
| 2015/0331307 A1* | 11/2015 | Lu | G03F 1/80 430/5 |
| 2016/0011344 A1* | 1/2016 | Beasley | C23C 14/5853 427/160 |
| 2016/0178997 A1* | 6/2016 | Watanabe | G03F 1/24 430/5 |
| 2017/0242330 A1* | 8/2017 | Hanekawa | G03F 1/54 |
| 2017/0269469 A1* | 9/2017 | Takai | G03F 1/24 |
| 2017/0315438 A1 | 11/2017 | Qi et al. | |
| 2017/0351169 A1* | 12/2017 | Yu | G03F 1/24 |
| 2019/0163051 A1* | 5/2019 | Chang | G03F 7/2004 |
| 2019/0384156 A1* | 12/2019 | Tanabe | G03F 1/54 |
| 2021/0072634 A1* | 3/2021 | Shiobara | G03F 1/24 |
| 2021/0096456 A1* | 4/2021 | Suzuki | G03F 1/48 |
| 2021/0397075 A1* | 12/2021 | Lin | G03F 1/22 |

FOREIGN PATENT DOCUMENTS

| | | | | |
|---|---|---|---|---|
| JP | 2009071126 A | * | 4/2009 | |
| JP | 2010206177 A | * | 9/2010 | B82Y 10/00 |
| JP | 2013206936 A | * | 10/2013 | |
| JP | 2014170931 A | * | 9/2014 | |
| JP | 2015138936 A | * | 7/2015 | |
| JP | 2017054070 A | * | 3/2017 | |
| JP | 2017227702 A | * | 12/2017 | |
| JP | 2021039271 A | * | 3/2021 | G03F 1/24 |
| KR | 20190129661 A | * | 11/2019 | |
| TW | 201905580 A | | 2/2019 | |
| TW | 202034064 A | | 9/2020 | |
| TW | 202041963 A | | 11/2020 | |
| TW | 202101108 A | | 1/2021 | |
| TW | 202121502 A | | 6/2021 | |
| WO | WO-2006033442 A1 | * | 3/2006 | B82Y 10/00 |
| WO | WO-2011030521 A1 | * | 3/2011 | G03F 1/14 |
| WO | WO-2013156328 A2 | * | 10/2013 | B82Y 10/00 |

* cited by examiner

EUV PHOTO MASKS AND MANUFACTURING METHOD THEREOF

BACKGROUND

Photolithography operations are one of the key operations in the semiconductor manufacturing process. Photolithography techniques include ultraviolet lithography, deep ultraviolet lithography, and extreme ultraviolet lithography (EUVL). The photo mask is an important component in photolithography operations. It is critical to fabricate EUV photo masks having a high contrast with a high reflectivity part and a high absorption part.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
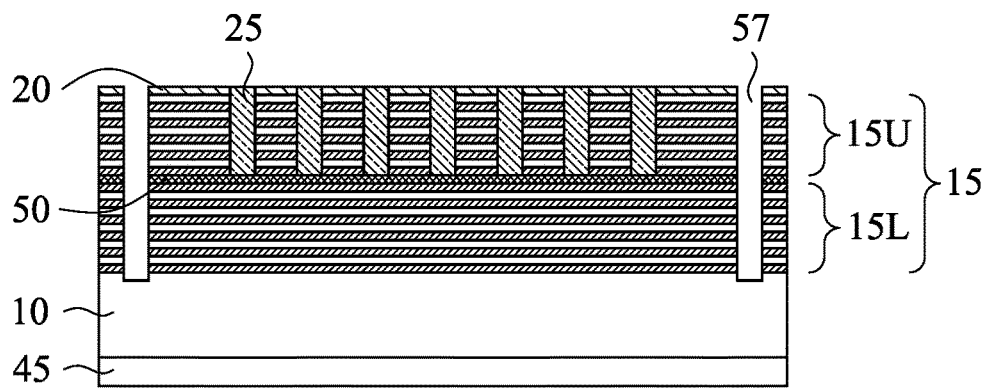
FIGS. 1, 2, 3, 4, 5 and 6 show cross sectional views of an EUV photo mask according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, processes and/or dimensions as explained with respect to one embodiment may be employed in other embodiments and detailed description thereof may be omitted. In the present disclosure, the phrase "a layer is made of or includes a material M" (M is atomic element) means that the layer is made only of a material M having a purity of more than 99% and does not mean any alloys or compound, unless otherwise described.

Embodiments of the present disclosure provide a method of manufacturing an EUV photo mask. More specifically, the present disclosure provides techniques to prevent or suppress damage on a backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. As a nature of reflective optical systems, the EUV light cannot be irradiated on the photo mask in the normal direction, and is inclined by, for example, 6 degrees from the normal direction. When circuit patterns are formed in an absorber layer disposed over the reflective structure, a three dimensional effect of the height of the absorber layer may cause CD (critical dimension) variation or other issues. In the present disclosure, an absorber layer is embedded in a reflective multilayer structure to suppress the three dimensional effect.

FIG. 1 shows a cross sectional view of an EUV reflective photo mask according to an embodiment of the present disclosure.

In some embodiments, the EUV photo mask includes a substrate 10, a multilayer Mo/Si stack 15 of multiple alternating layers of silicon and molybdenum, a capping layer 20 and an absorber layer 25. Further, a backside conductive layer 45 is formed on the backside of the substrate 10, as shown in FIG. 1. In some embodiments, an intermediate layer 50, which functions as an etching stop layer, is disposed in the middle of the reflective multilayer structure 15 dividing the reflective multilayer structure 15 into an lower layer 15L and an upper layer 15U. Further, in some embodiments, a black border pattern 57 is formed to surround the circuit pattern area. In some embodiments, the black border pattern 57 penetrates into the substrate 10.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near infrared), and a portion of the ultraviolet wavelengths. In some embodiments, the low thermal expansion glass substrate absorbs extreme ultraviolet wavelengths and deep ultraviolet wavelengths near the extreme ultraviolet. The shape of the substrate 10 is square or rectangular in some embodiments.

In some embodiments, the Mo/Si multilayer stack 15 includes from about 30 alternating pairs of silicon and molybdenum layers to about 60 alternating pairs of silicon and molybdenum layers. In certain embodiments, from about 40 to about 50 alternating pairs of silicon and molybdenum layers are formed. In some embodiments, the reflectivity is higher than about 70% for the wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about 3 nm. In some embodiments, the bottommost layer of the multilayer stack 15 is a Si layer or a Mo layer.

In other embodiments, the reflective multilayer structure 15 includes alternating molybdenum layers and beryllium layers. In some embodiments, the number of pairs in the multilayer stack 15 is in a range from about 20 to about 100 although any number of layers is allowed as long as sufficient reflectivity is maintained for imaging the target substrate. In some embodiments, the reflectivity is higher than about 70% for the wavelengths of interest e.g., 13.5 nm. In some embodiments, the reflective multilayer structure 15 includes about 30 to about 60 alternating layers of Mo and Be. In other embodiments of the present disclosure, the multilayer stack 15 includes about 40 to about 50 alternating layers each of Mo and Be. Further, in some embodiments, the uppermost layer of the reflective multilayer structure 15 is a Si layer, which is not in contact with the capping layer 20.

The capping layer 20 is disposed over the reflective multilayer structure 15 to prevent oxidation of the multilayer stack 15 in some embodiments. In some embodiments, the capping layer 20 is made of elemental ruthenium (more than 99% Ru, not a Ru compound), a ruthenium alloy (e.g., RuNb, RuZr, RuZrN, RuRh, RuNbN, RuRhN, RuV, RuVN, RuIr, RuTi, RuB, RuP, RuOs, RuPd, RuPt or RuRe) or a ruthenium based oxide (e.g., $RuO_2$, RuNbO, RiVO or RuON), having a thickness of from about 2 nm to about 10 nm. In some embodiments, the capping layer 20 is a ruthenium compound $Ru_xM_{1-x}$, where M is one or more of Nb, Ir, Rh, Zr, Ti, B, P, V, Os, Pd, Pt or Re, and x is more than zero and equal to or less than about 0.5.

In some embodiments, the thickness of the capping layer 20 is from about 1 nm to about 30 nm and is from about 2 nm to about 15 nm in other embodiments. In certain embodiments, the thickness of the capping layer 20 is from about 3 nm to about 10 nm. In some embodiments, the capping layer 20 has a thickness of 3.5 nm±10%. In some embodiments, the capping layer 20 is formed by chemical vapor deposition, plasma-enhanced chemical vapor deposition, atomic layer deposition, physical vapor deposition (e.g., sputtering), or any other suitable film forming method. In other embodiments, a Si layer is used as the capping layer 20. One or more layers are disposed between the capping layer and the multilayer 15 as set forth below in some embodiments.

In some embodiments, the capping layer 20 includes two or more layers of different materials. In some embodiments, the capping layer 20 includes two or more layers of different Ru based materials. In some embodiments, the capping layer 20 includes two layers, a lower layer and a upper layer, and the upper layer has a higher carbon absorption resistance than the lower layer, and the lower layer has a higher etching resistance during the absorber etching. In certain embodiments, the capping layer 20 includes a RuNb based layer (RuNb or RuNbN) disposed on a RuRh based layer (RuRh or RuRhN). In some embodiments, the capping layer 20 includes one or more of Ru, Ti, Ni, Co, Ir, In, Ta, Te, Al, Cr, Zr, Cu, Zn, Y, Nb, Tc, Pt, Rh, Ga, or Tl, or their alloys, oxides, nitrides.

The absorber layer 25 is disposed in trenches formed in the upper layer 15U of the reflective multilayer structure 15, as shown in FIG. 1. The absorber layer 25 includes a high EUV absorption material having a k value more than about 0.03 or more than about 0.045. In some embodiments, the absorber layer 25 is Ta based material. In some embodiments, the absorber layer 25 is made of TaN, TaO, TaB, TaBO or TaBN. In other embodiments, the absorber layer 25 includes a Cr based material, such as CrN, CrBN, CrO and/or CrON. In some embodiments, the absorber layer 25 has a multilayered structure of Cr, CrO or CrON. In some embodiments, the absorber layer is Ir or an Ir based material, such as, IrRu, IrPt, IrN, IrAl, IrSi or IrTi. In some embodiments, the absorber layer is a Ru based material, such as, IrRu, RuPt, RuN, RuAl, RuSi or RuTi, or a Pt based material, PtIr, RuPt, PtN, PtAl, PtSi or PtTi. In other embodiments, the absorber layer includes an Os based material, a Pd based material, or a Re based material. In some embodiments of the present disclosure, an X based material means that an amount of X is equal to or more than 50 atomic %.

In other embodiments, the absorber layer material is represented by $A_xB_y$, where A and B are each one or more of Ir, Pt, Ru, Cr, Ta, Os, Pd, Al or Re, and x:y is from about 0.25:1 to about 4:1. In some embodiments, x is different from y (smaller or larger). In some embodiments, the absorber layer further includes one or more of Si, B, or N in an amount of more than zero to about 10 atomic %.

In some embodiments, a cover or antireflective layer (not shown) is disposed over the absorber layer 25. In some embodiments, the cover layer includes a Ta based material, such as TaO or TaBO. In certain embodiments, the cover layer is made of tantalum oxide ($Ta_2O_5$ or non-stoichiometric (e.g., oxygen deficient) tantalum oxide), and has a thickness of from about 2 nm to about 20 nm. In other embodiments, a TaBO layer having a thickness in a range from about 2 nm to about 20 nm is used as the cover layer. In some embodiments, the thickness of the cover layer is from about 2 nm to about 5 nm. In some embodiments, the cover layer is formed by oxidation of the absorber layer 25.

In some embodiments, the upper surface of the absorber layer 25 is flush with the upper surface of the capping layer 20. In other embodiments, the upper surface of the absorber layer 25 is lower than the upper surface of the capping layer 20 and higher than the lower surface of the capping layer 20.

In some embodiments, the upper surface of the absorber layer 25 is lower than the upper surface of the capping layer 20 by about 0.5 nm to about 1 nm.

Further, in some embodiments, an intermediate layer 50 is disposed in the middle of the reflective multilayer 15. In some embodiments, the intermediate layer 50 includes one or more of Ru, Ti, V, Ni, Co, Ir, In, Ta, Te, Al, Cr, Zr, Cu, Zn, Y, Nb, Tc, Os, Pd, Pt, Rh, Re, Ga, or Tl, or their alloys, oxides, nitrides. In some embodiments, the intermediate layer includes one or more of BC, BN, CN or graphene. In some embodiments, the material of the intermediate layer 50 is selected from the materials for the capping layer 20 as set forth above. In some embodiments, the intermediate layer 50 is made of the same material as the capping layer 20, and in other embodiments, the intermediate layer 50 is made of a different material than the capping layer 20. In certain embodiments, the intermediate layer 50 is other than Ru, Cr (metal Ru and metal Cr), Si, Si compound and carbon.

In some embodiments, the thickness of the intermediate layer 50 is from about 1 nm to about 30 nm and is from about 2 nm to about 15 nm in other embodiments. In certain embodiments, the thickness of the intermediate layer 50 is from about 3 nm to about 10 nm. In some embodiments, the intermediate layer 50 is formed by chemical vapor deposition, plasma-enhanced chemical vapor deposition, atomic layer deposition, physical vapor deposition (e.g., sputtering), or any other suitable film forming method. When the thickness of the intermediate layer is larger than these ranges, it may degrade reflectivity of the reflective multilayer structure 15 and when the thickness is smaller than these ranges, the intermediate layer may not sufficiently function as an etch stop layer.

In some embodiments, the number of pairs of Mo/Si in the upper layer 15U is equal to or smaller than the number of pairs of Mo/Si in the lower layer 15L. In other embodiments, the number of pairs of Mo/Si in the upper layer 15U is greater than the number of pairs of Mo/Si in the lower layer 15L. In some embodiments, each of the upper layer 15U and the lower layer 15L includes about 20 to about 40 pairs of Mo/Si layers.

In some embodiments, the backside conductive layer 45 is disposed on a second main surface of the substrate 10 opposing the first main surface of the substrate 10 on which the Mo/Si multilayer 15 is formed. In some embodiments, the backside conductive layer 45 is made of TaB (tantalum boride) or other Ta based conductive material. In some embodiments, the tantalum boride is crystalline. The crystalline tantalum boride includes TaB, $Ta_5B_6$, $Ta_3B_4$ and $TaB_2$. In other embodiments, the tantalum boride is poly crystalline or amorphous. In other embodiments, the backside conductive layer 45 is made of a Cr based conductive material (CrN or CrON). In some embodiments, the sheet resistance of the backside conductive layer 45 is equal to or smaller than 20Ω/□. In certain embodiments, the sheet resistance of the backside conductive layer 45 is equal to or more than 0.1Ω/□. In some embodiments, the surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, the flatness of the backside conductive layer 45 is equal to or less than 50 nm. In some embodiments, the flatness of the backside conductive layer 45 is more than 1 nm. A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm. In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

Figure 2:
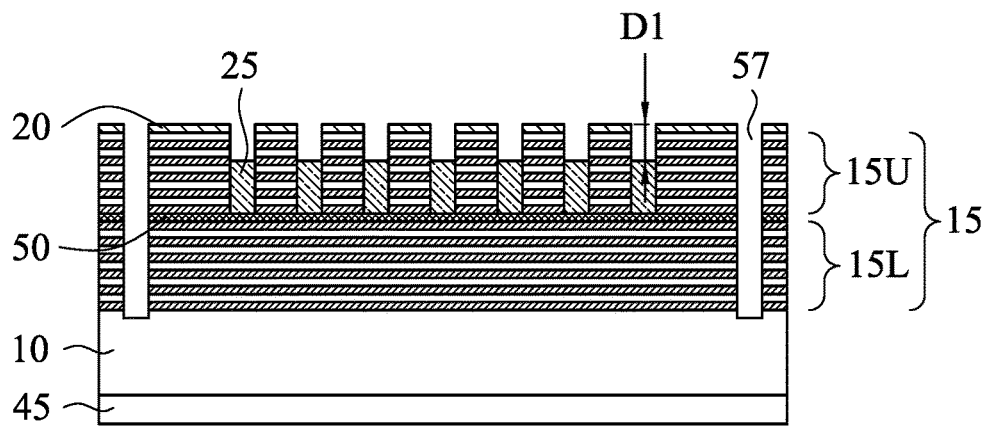

FIG. 2 shows a cross sectional view of an EUV reflective photo mask according to an embodiment of the present disclosure. Materials, configurations, processes and/or dimensions explained with respect to the above embodiments can be applied to the following embodiments, and thus detailed explanation is omitted for simplicity.

In some embodiments, the absorber layer 25 is recessed from the upper surface of the capping layer 20 as shown in FIG. 2. In some embodiments, the absorber layer 25 is recessed from the upper surface of the reflective multilayer structure 15. The depth D1 from the upper surface of the capping layer 20 to the absorber layer 25 is in a range from about 5 nm to about 100 nm in some embodiments, and is in a range from about 10 nm to about 50 nm in other embodiments.

Figure 3:
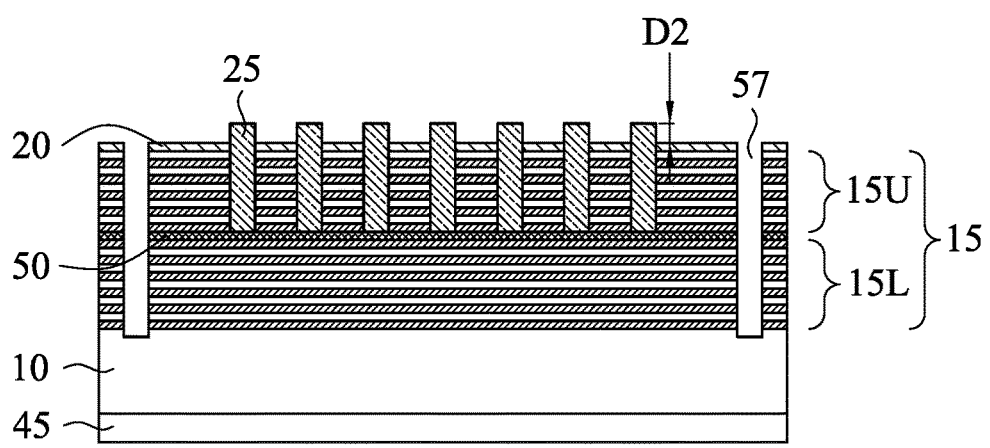

FIG. 3 shows a cross sectional view of an EUV reflective photo mask according to an embodiment of the present disclosure. Materials, configurations, processes and/or dimensions explained with respect to the above embodiments can be applied to the following embodiments, and thus detailed explanation is omitted for simplicity.

In some embodiments, the absorber layer 25 protrudes from the upper surface of the capping layer 20 as shown in FIG. 3. The height D2 from the upper surface of the capping layer 20 to the top of the absorber layer 25 is in a range from about 4 nm to about 50 nm in some embodiments, and is in a range from about 5 nm to about 30 nm in other embodiments. The height (protruding amount) D2 depends on the thickness of the hard mask layer (explained later) in some embodiments. When the height D2 is too large, it may cause a three dimensional effect and near-field diffraction at the edges of the absorber layer 25.

Figure 4:
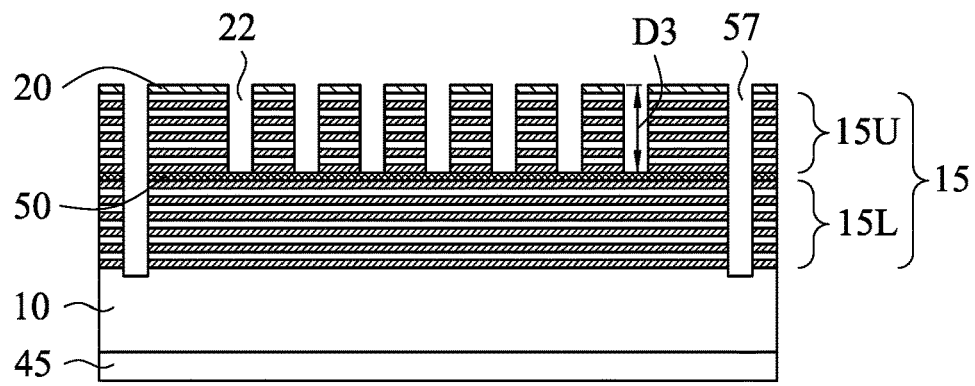

FIG. 4 shows a cross sectional view of an EUV reflective photo mask according to an embodiment of the present disclosure. Materials, configurations, processes and/or dimensions explained with respect to the above embodiments can be applied to the following embodiments, and thus detailed explanation is omitted for simplicity.

In some embodiments, no absorber layer is disposed in the trenches 22 formed in the reflective multilayer structure 15, and the intermediate layer 50 is exposed at the bottoms of the trenches 22. In some embodiments, an EUV photo mask shown in FIG. 4 is a phase shift mask. In some embodiments, the depth D3 of the trench is set to have an appropriate phase difference between the reflected EUV light from the reflective multilayer structure 15 (15U+15L) and the reflected EUV light from the lower layer 15L.

Figure 5:
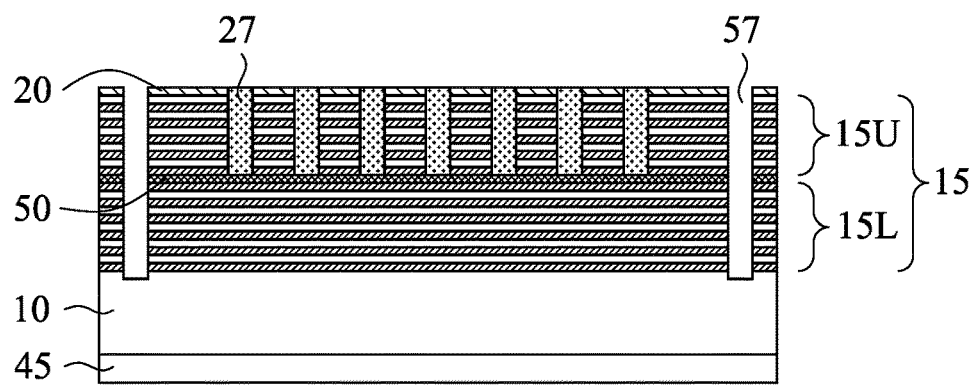

FIG. 5 shows a cross sectional view of an EUV reflective photo mask according to an embodiment of the present disclosure. Materials, configurations, processes and/or dimensions explained with respect to the above embodiments can be applied to the following embodiments, and thus detailed explanation is omitted for simplicity.

In some embodiments, instead of an absorber layer, the trenches formed in the upper layer 15U are filled with a protective layer 27, which is substantially EUV transmissive material (e.g., transmittance of more than 70%), as shown in FIG. 5. In some embodiments, the protective layer 27 include silicon oxide, silicon nitride, polysilicon, silicon carbide or any other suitable material. The protective layer 27 suppresses corruption of fine patterns formed in the upper layer 15U and prevents oxidation of side faces of the upper layer 15U. In some embodiments, the protective layer 27 is also formed to fill the black border pattern 57.

Figure 6:
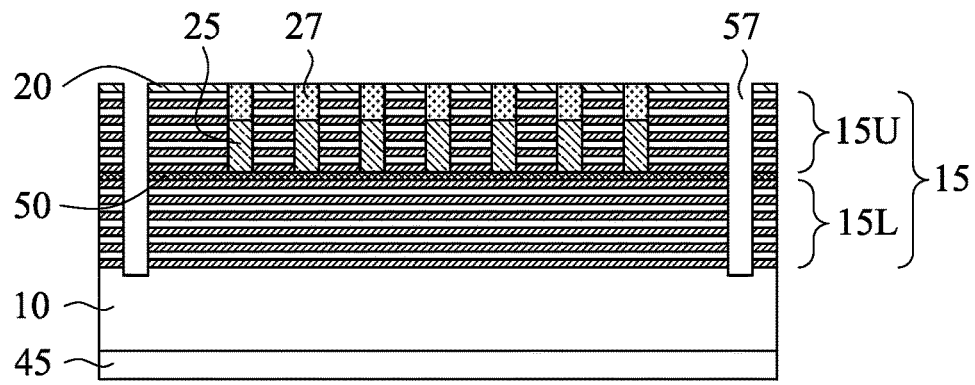

FIG. 6 shows a cross sectional view of an EUV reflective photo mask according to an embodiment of the present disclosure. Materials, configurations, processes and/or dimensions explained with respect to the above embodiments can be applied to the following embodiments, and thus detailed explanation is omitted for simplicity.

In some embodiments, the trenches formed in the upper layer 15U are filled with an absorber layer 25 and a protective layer 27, which is a substantially EUV transmissive material, as shown in FIG. 6. The configuration of the absorber layer 25 is the same as that shown in FIG. 2 in some embodiments. In some embodiments, the protective layer 27 includes silicon oxide, silicon nitride, polysilicon, silicon carbide or any other suitable material. The protective layer 27 suppresses corruption of fine patterns formed in the upper layer 15U and prevents oxidation of side faces of the upper layer 15U. In some embodiments, the protective layer 27 also fills the black border pattern 57.

FIGS. 7A-7E schematically illustrate a sequential method of fabricating an EUV photo mask for use in extreme ultraviolet lithography (EUVL). It is understood that additional operations can be provided before, during, and after processes shown by FIGS. 7A-7E, and some of the operations described below can be replaced or eliminated for additional embodiments of the method. The order of the operations/processes may be interchangeable. Materials, configurations, processes and/or dimensions explained with respect to the above embodiments can be applied to the following embodiments, and thus detailed explanation is omitted for simplicity.

In the fabrication of an EUV photo mask, a first photoresist layer 35 is formed over a mask blank. The mask blank includes a substrate 10, a reflective multilayer structure 15 (Mo/Si layers), a capping layer 20 and a hard mask layer 30.

The hard mask layer 30 is disposed over the capping layer 20 in some embodiments. In some embodiments, the hard mask layer 30 is made of a Cr based material, such as CrO, CrON or CrCON. In other embodiments, the hard mask layer 30 is made of a Ta based material, such as TaB, TaO, TaBO or TaBN. In other embodiments, the hard mask layer 30 is made of silicon, a silicon based compound (e.g., SiN or SiON), ruthenium or a ruthenium based compound (Ru or RuB). The hard mask layer 30 has a thickness of about 5 nm to about 50 nm in some embodiments. In some embodiments, the hard mask layer 30 includes two or more different material layers. In some embodiments, the hard mask layer 30 is formed by chemical vapor deposition, plasma-enhanced chemical vapor deposition, atomic layer deposition, physical vapor deposition, or any other suitable film forming method.

Figure 7A:
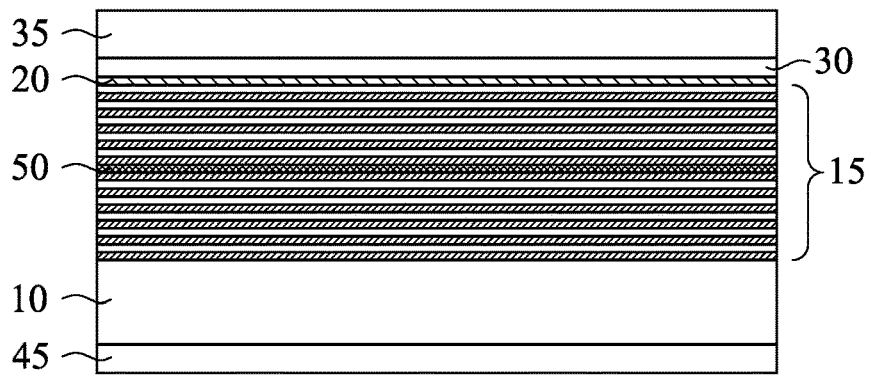
FIGS. 7A, 7B, 7C, 7D, 7E and 7F schematically illustrate a sequential method of fabricating an EUV photo mask according to an embodiment of the present disclosure.
Figure 7B:
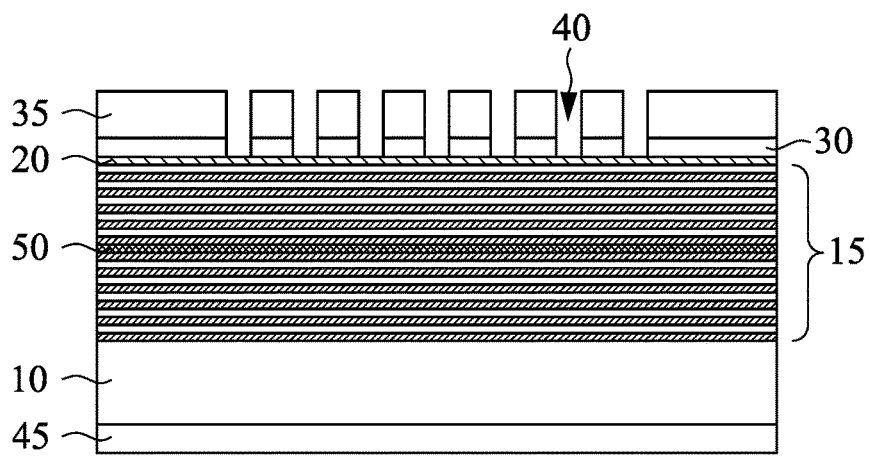

The first photoresist layer 35 is selectively exposed to actinic radiation, such as an electron beam. Before the first photoresist layer 35 is formed, the EUV photo mask blank is subject to inspection in some embodiments. The selectively exposed first photoresist layer 35 is developed to form a pattern 40 in the first photoresist layer 35. In some embodiments, the pattern 40 corresponds to a pattern of semiconductor device features for which the EUV photo mask will be used to form in subsequent operations. Next, the pattern 40 in the first photoresist layer 35 is extended into the hard mask layer 30, as shown in FIG. 7B. The pattern 40 extended into the hard mask layer 30 is formed by etching, in some embodiments, using a suitable wet or dry etchant that is selective to the capping layer 20. After the pattern 40 in the hard mask layer 30 is formed, the first photoresist layer 35 is removed by a photoresist stripper to expose the upper surface of the hard mask layer 30.

Figure 7C:
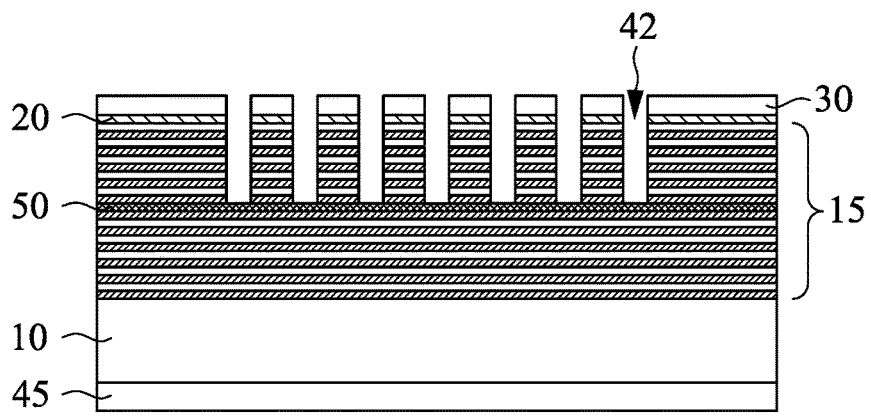

Then, the pattern 40 in the hard mask layer 30 is extended into the capping layer 20 and the reflective multilayer structure 15, thereby forming a trench pattern 42, as shown in FIG. 7C. In some embodiments, the etching substantially stops at the intermediate layer 50 as shown in FIG. 7C.

Figure 7D:
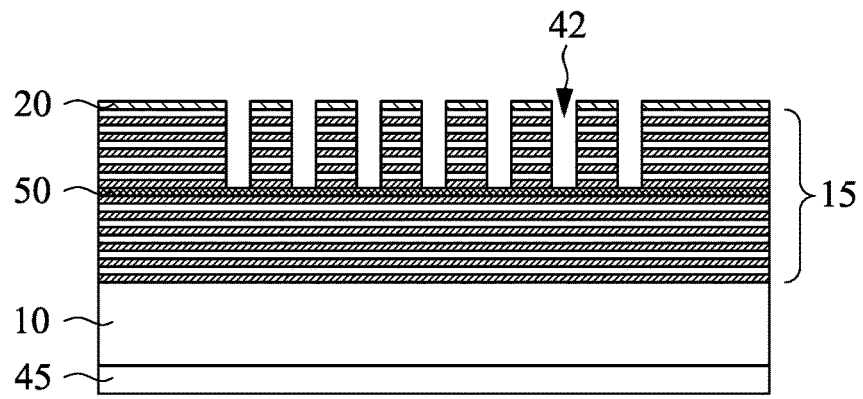

The trench pattern 42 extended into the capping layer 20 and the reflective multilayer structure 15 is formed by etching, in some embodiments, using a suitable wet or dry etchant that is selective to the capping layer 20 and the multilayer structure 15. In some embodiments, plasma dry etching is used. In some embodiments, when the intermediate layer 50 is made of the same material as or similar material to the hard mask layer 30, or when the intermediate layer 50 and the hard mask layer 30 have similar etching resistivity to the etching, the etching substantially stops at the intermediate layer 50. In some embodiments, about 0.1 nm to about 0.3 nm of the surface of the intermediate layer 50 is etched. Then the hard mask layer 30 is removed as shown in FIG. 7D.

In some embodiments, the capping layer 20 is patterned by using the patterned hard mask layer 30, and then the reflective multilayer structure 15 is patterned by using the patterned capping layer 20 as an etching mask with or without the hard mask layer 30 (i.e.—the capping layer functions as a hard mask).

Figure 7E:
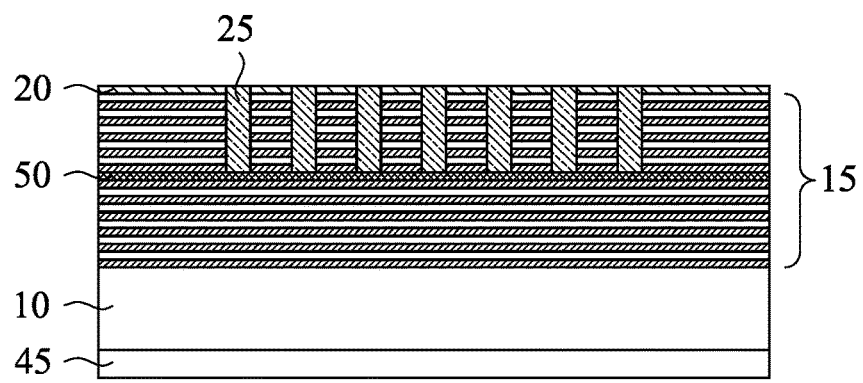

Next, as shown in FIG. 7E, one or more layers for the absorber layer 25 is formed in the trench pattern 42 and over the capping layer 20. Then, a planarization operation, such as a chemical mechanical polishing (CMP) operation, is performed to remove excess material on the capping layer 20 to form the absorber layer (pattern) 25, as shown in FIG. 7E. In some embodiments, the hard mask layer 30 is not removed before forming the one or more layers for the absorber layer 25 and is removed after or during the CMP operation.

Figure 7F:
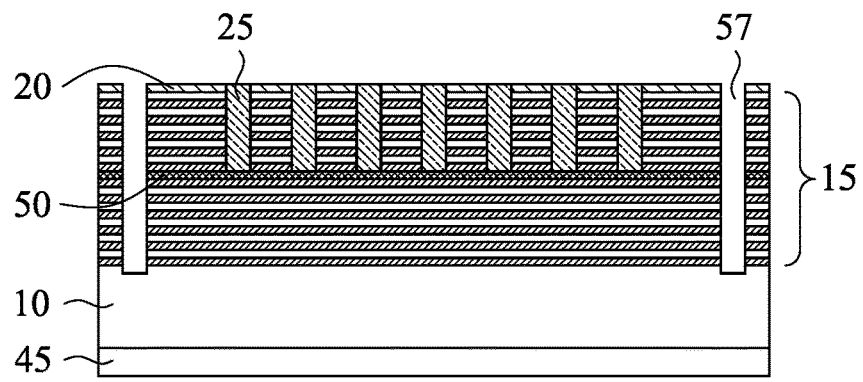

Then, in some embodiments, an antireflective layer (not shown) is formed on the absorber layer 25. When the absorber layer 25 is made of a Ta based material, the antireflective layer is formed by oxidation of the absorber layer 25. Subsequently, black border pattern is formed as follows. A second photoresist layer is formed over the structure of FIG. 7E, and the second photoresist layer is selectively exposed to actinic radiation such as electron beam, ion beam or UV radiation. The selectively exposed second photoresist layer is developed to form a pattern in the second photoresist layer. The pattern corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments. Next, the pattern in the second photoresist layer is extended into the capping layer 20, the reflective multilayer structure 15 and the intermediate layer 50, forming a black border pattern 57, as shown in FIG. 7F. The black border pattern 57 is formed by etching, in some embodiments, using one or more suitable wet or dry etchants that are selective to each of the layers that are etched. In some embodiments, plasma dry etching is used. Then, the second photoresist layer is removed by a suitable photoresist stripper, as shown in FIG. 7F. The black border pattern 57 defines a black border of the photo mask in some embodiments of the disclosure.

Figure 8A:
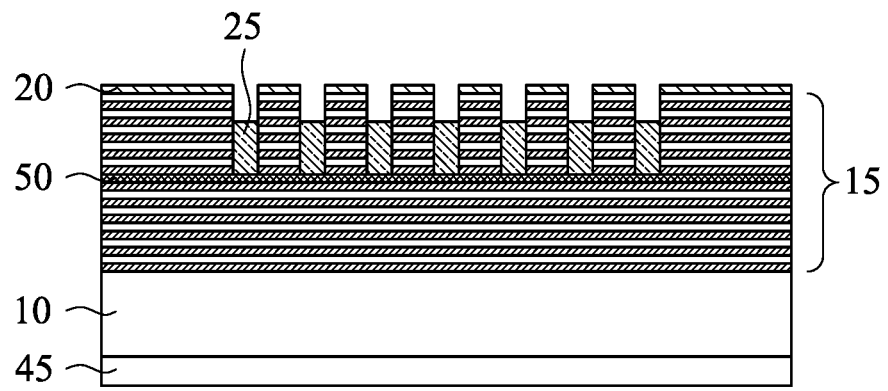
FIGS. 8A and 8B schematically illustrate a sequential method of fabricating an EUV photo mask according to an embodiment of the present disclosure.
Figure 8B:
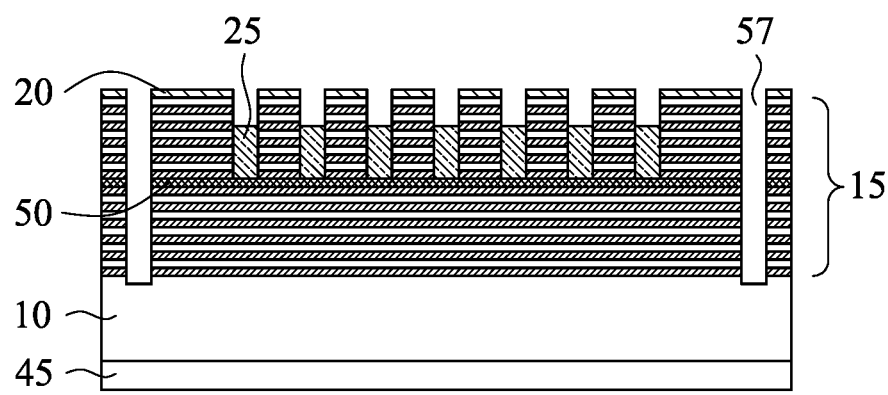

FIGS. 8A and 8B schematically illustrate a sequential method of fabricating an EUV photo mask for use in EUVL. It is understood that additional operations can be provided before, during, and after processes shown by FIGS. 8A and 8B, and some of the operations described below can be replaced or eliminated for additional embodiments of the method. The order of the operations/processes may be interchangeable. Materials, configurations, processes and/or dimensions explained with respect to the above embodiments can be applied to the following embodiments, and thus the detailed explanation is omitted for simplicity.

After the structure shown in FIG. 7E is formed, the absorber layer 25 is recessed using an etching operation so that the upper surface of the absorber layer 25 is located below the upper surface of the capping layer 20 or below the upper surface of the reflective multilayer structure 15, as shown in FIG. 8A. The etching operation includes one or more plasma dry etching and wet etching. Then, as shown in FIG. 8B, a black border pattern 57 is formed.

Figure 9A:
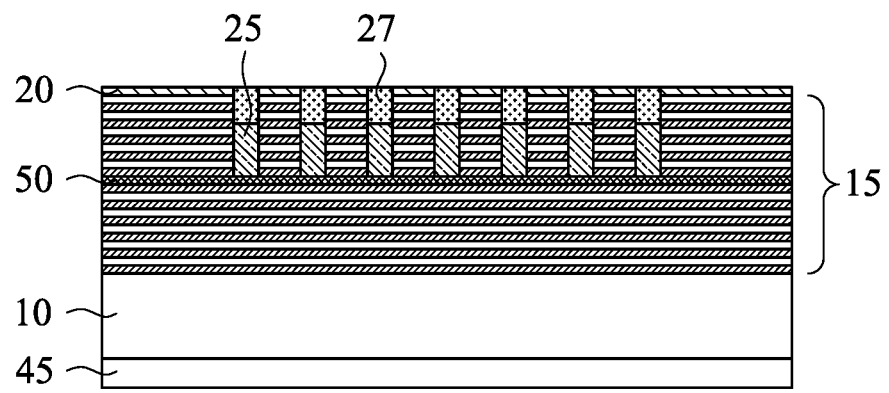
FIGS. 9A and 9B schematically illustrate a sequential method of fabricating an EUV photo mask according to an embodiment of the present disclosure.
Figure 9B:
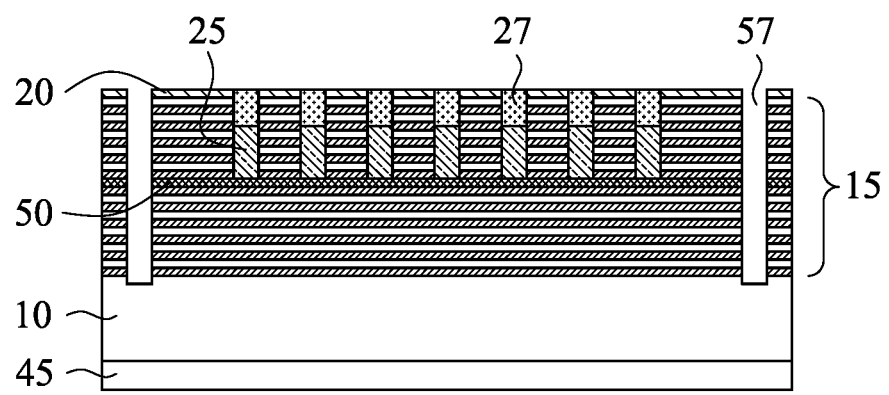

FIGS. 9A and 9B schematically illustrate a sequential method of fabricating an EUV photo mask for use in EUVL. It is understood that additional operations can be provided before, during, and after processes shown by FIGS. 9A and 9B, and some of the operations described below can be replaced or eliminated for additional embodiments of the method. The order of the operations/processes may be interchangeable. Materials, configurations, processes and/or dimensions explained with respect to the above embodiments can be applied to the following embodiments, and thus detailed explanation is omitted for simplicity.

After the structure shown in FIG. 8A is formed, a protective layer 27 is formed over the absorber layer 25, as shown in FIG. 9A. One or more layers for the protective layer 27 is formed in the trench pattern over the absorber layer 25 and over the capping layer 20. Then, a planarization operation, such as a CMP operation, is performed to remove excess material on the capping layer 20 to form the protective layer 27, as shown in FIG. 9A. Then, as shown in FIG. 9B, a black border pattern 57 is formed. In other embodiments, after the black border pattern 57 is formed, the protective layer 27 is formed, and in such a case, the protective layer 27 is also formed in the black border pattern 57.

Figure 10A:
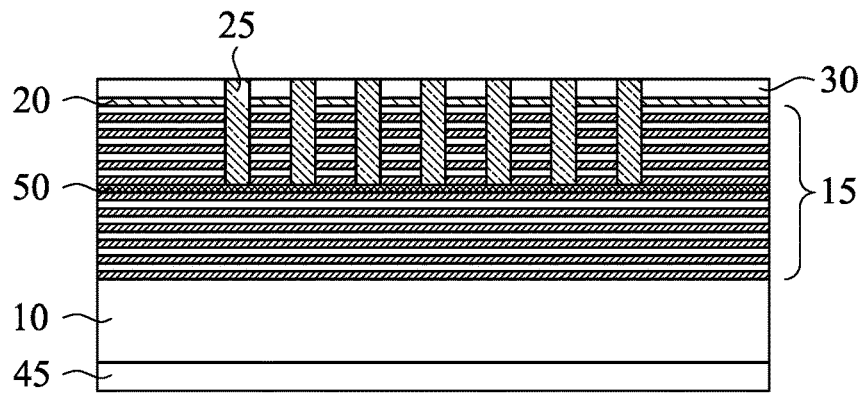
FIGS. 10A, 10B and 10C schematically illustrate a sequential method of fabricating an EUV photo mask according to an embodiment of the present disclosure.
Figure 10B:
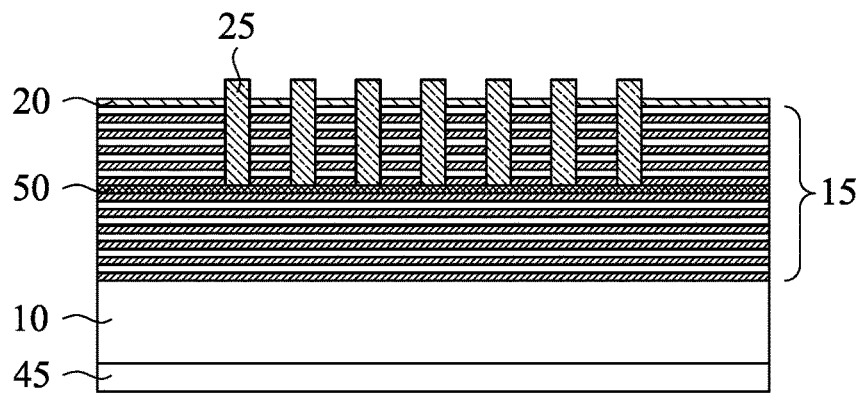
Figure 10C:
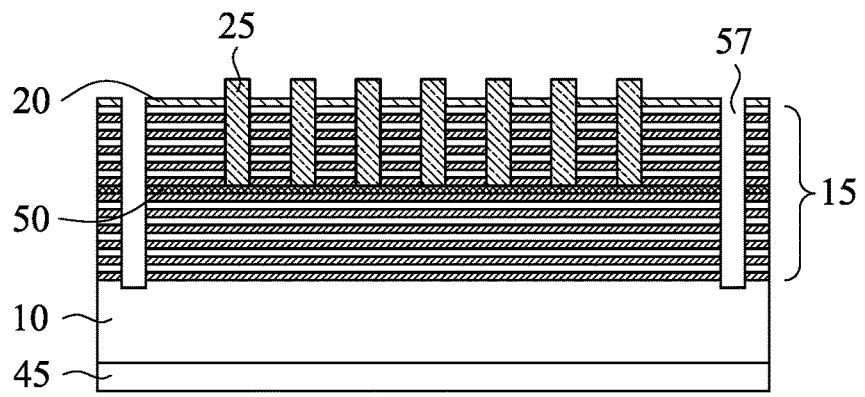

FIGS. 10A-10C schematically illustrate a sequential method of fabricating an EUV photo mask for use in EUVL. It is understood that additional operations can be provided before, during, and after processes shown by FIGS. 10A-10C, and some of the operations described below can be replaced or eliminated for additional embodiments of the method. The order of the operations/processes may be interchangeable. Materials, configurations, processes and/or dimensions explained with respect to the above embodiments can be applied to the following embodiments, and thus detailed explanation is omitted for simplicity.

After the structure shown in FIG. 7C is formed, an absorber layer 25 is formed in the trench pattern, as shown in FIG. 10A. One or more layers for the absorber layer 25 is formed in the trench pattern 42 and over the hard mask layer 30. Then, a planarization operation, such as a CMP operation, is performed to remove excess material on the hard mask layer 30 to form the absorber layer (pattern) 25, as shown in FIG. 10A. Subsequently the hard mask layer 30 is removed by using suitable etching operations, such as wet etchings, as shown in FIG. 10B. By removing the hard mask layer 30, the absorber layer 25 protrudes from the upper surface of the capping layer. Then, as shown in FIG. 10C, a black border pattern 57 is formed.

Figure 11A:
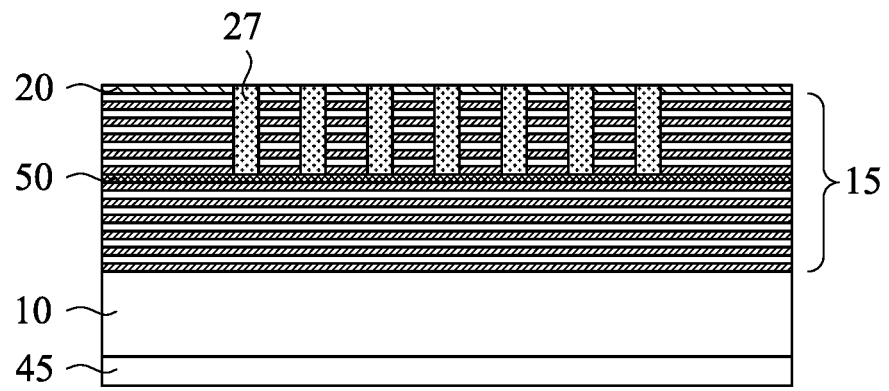
FIGS. 11A and 11B schematically illustrate a method of fabricating an EUV photo mask according to an embodiment of the present disclosure.
Figure 11B:
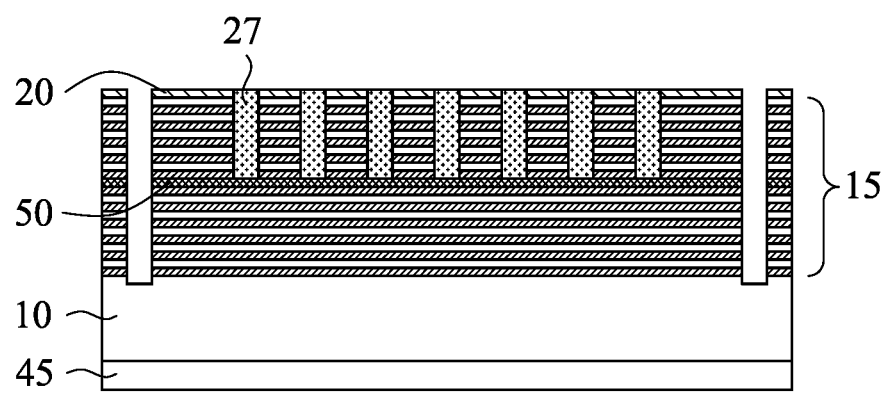

FIGS. 11A and 11B schematically illustrate a sequential method of fabricating an EUV photo mask for use in EUVL. It is understood that additional operations can be provided before, during, and after the processes shown by FIGS. 11A and 11B, and some of the operations described below can be replaced or eliminated for additional embodiments of the method. The order of the operations/processes may be interchangeable. Materials, configurations, processes and/or dimensions explained with respect to the above embodiments can be applied to the following embodiments, and thus detailed explanation is omitted for simplicity.

After the structure shown in FIG. 7B is formed, a protective layer 27 is formed in the trench pattern, as shown in FIG. 11A. One or more layers for the protective layer 27 is formed in the trench pattern and over the capping layer 20, and then, a planarization operation, such as a CMP operation, is performed to remove excess material on the capping layer 20 to form the protective layer 27, as shown in FIG. 11A. Then, as shown in FIG. 11B, a black border pattern 57 is formed. In other embodiments, after the black border pattern 57 is formed, the protective layer 27 is formed, and in such a case, the protective layer 27 is also formed in the black border pattern 57.

Figure 12:
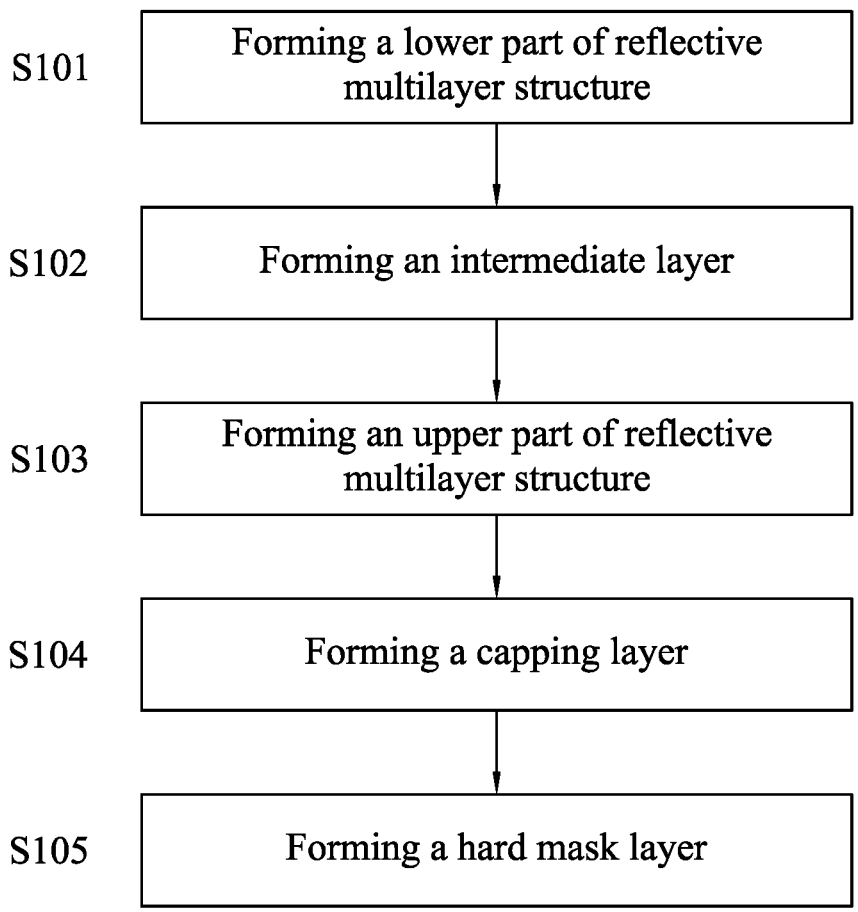
FIG. 12 shows a flowchart of a method of making a reflective mask blank according to an embodiment of the present disclosure.

FIG. 12 shows a flow chart of manufacturing a mask blank of one or more of the foregoing embodiments. It is understood that additional operations can be provided before, during, and after process steps shown in FIG. 12, and some of the operations described below can be replaced or eliminated for additional embodiments of the method. The order of the operations/processes may be interchangeable.

At S101, a lower part of reflective multilayer structure is formed on a substrate. In some embodiments, one or more layers are formed on the substrate before forming the reflective multilayer structure. In some embodiments, the reflective multilayer structure is formed by an ion beam deposition method or a sputtering method.

At S102, an intermediate (etch stop) layer is formed on the lower part of the reflective multilayer structure. In some embodiments, the intermediate layer is formed by an ion beam deposition method or a sputtering method. In some embodiments, the intermediate layer is continuously formed on the lower part of the multilayer stack by an ion bean deposition method in the same deposition apparatus as for the reflective multilayer structure.

Then, at S103, an upper part of the reflective multilayer structure is formed on the intermediate layer. In some embodiments, the upper part of the reflective multilayer structure is terminated with a Si layer and in other embodiments, the multilayer stack is terminated with a Mo layer. In some embodiments, the upper part is continuously formed on the intermediate layer by an ion bean deposition method in the same deposition apparatus as for the intermediate layer.

At S104, a capping layer is formed on the upper part of the reflective multilayer structure. In some embodiments, the capping layer is continuously formed on the multilayer stack by an ion bean deposition method in the same deposition apparatus as for the reflective multilayer structure. At S105, a hard mask layer is formed on the capping layer.

Figure 13A:
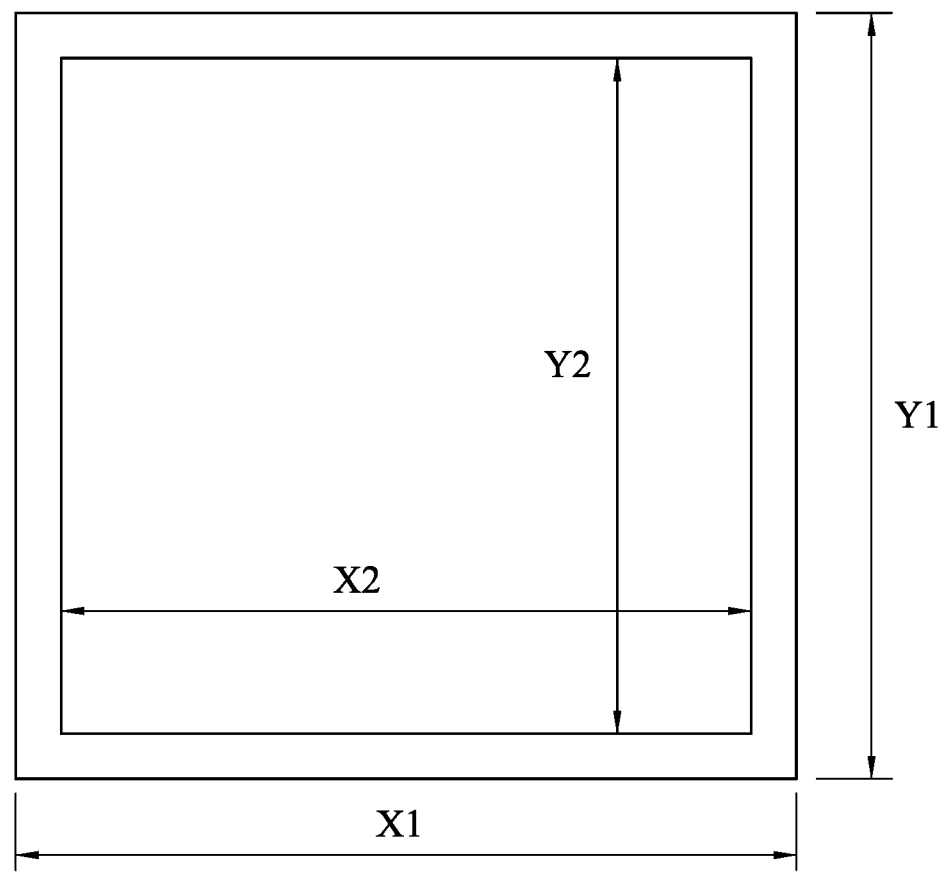
FIGS. 13A and 13B show EUV photo mask blanks and FIG. 13C shows an EUV photo mask according to embodiments of the present disclosure.
Figure 13B:
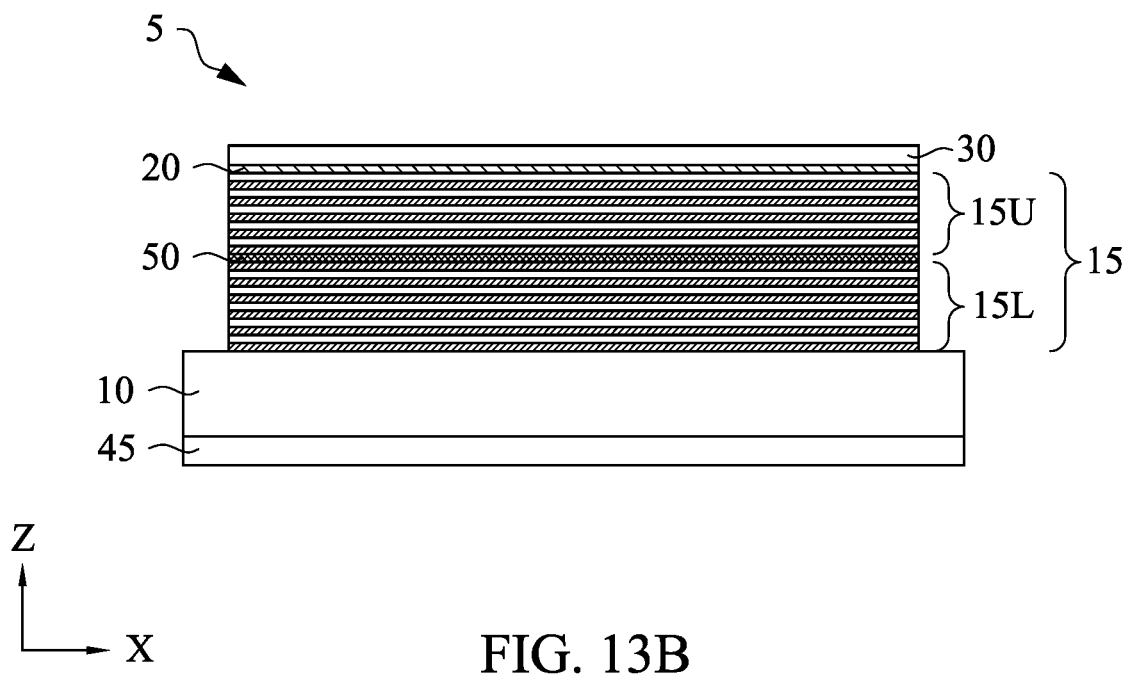
Figure 13C:
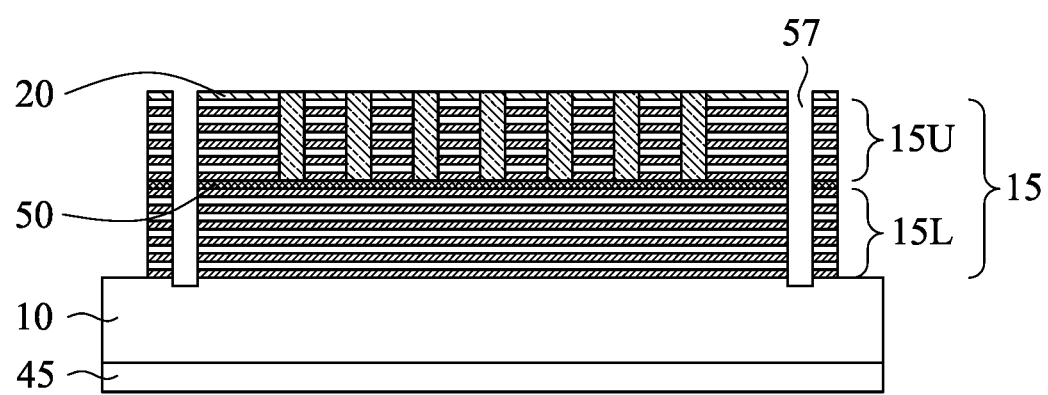

FIGS. 13A and 13B show an EUV reflective photo mask blank 5 according to an embodiment of the present disclosure. FIG. 13C shows a patterned EUV reflective photo mask ready for use in EUV lithography. FIG. 13A is a plan view (viewed from the top) and FIG. 13B is a cross sectional view along the X direction.

In some embodiments, the functional layers above the substrate (the multilayer Mo/Si stack 15, the intermediate layer 50, the capping layer 20, and the hard mask layer 30) have the same size as the substrate (X1=X2 and Y1=Y2). In other embodiments, the functional layers has a smaller size than the substrate 10, as shown in FIGS. 12A and 12B (X2<X1 and Y2<Y1). In some embodiments, the size of the functional layers is in a range from about 138 mm×138 mm to 142 mm×142 mm. The shape of the functional layers is square or rectangular in some embodiments. The smaller size of one or more of the functional layers can be formed by using a frame shaped cover having an opening in a range from about 138 mm×138 mm to about 142 mm×142 mm, when forming the respective layers by, for example, sputtering. In other embodiments, all of the layers above the substrate 10 have the same size as the substrate 10.

Figure 14A:
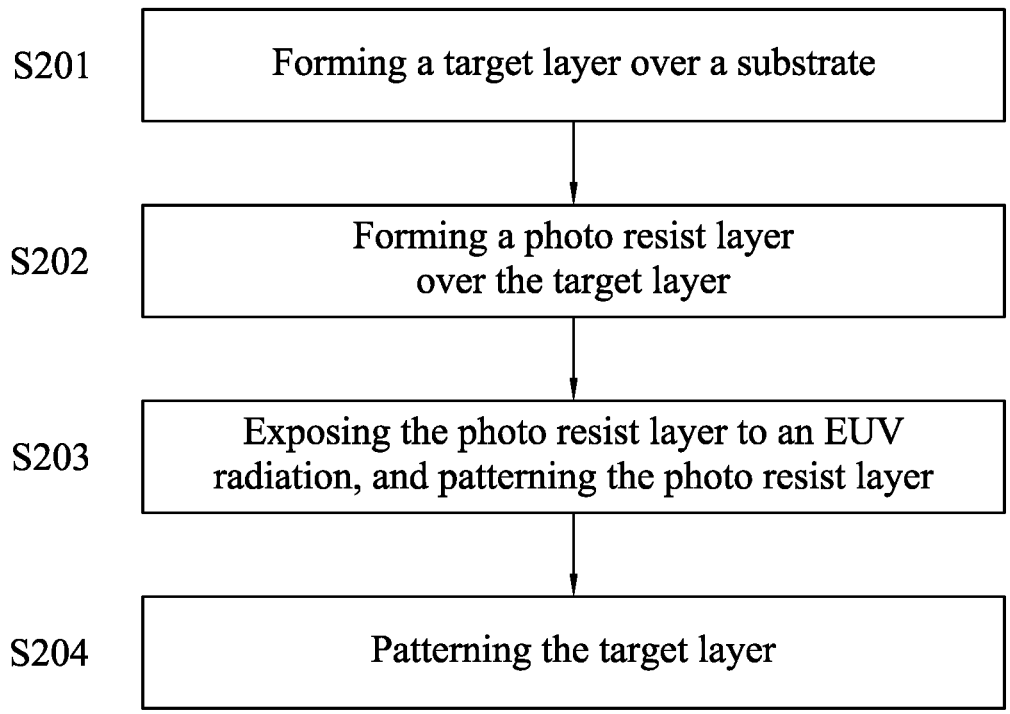
FIG. 14A shows a flowchart of a method of making a semiconductor device.
Figure 14B:
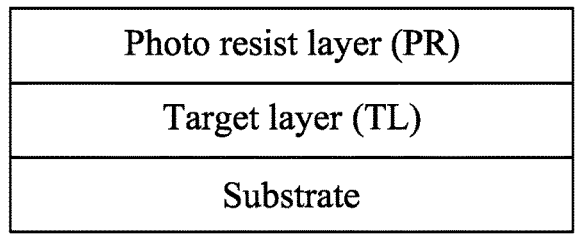
FIGS. 14B, 14C, 14D and 14E show a sequential manufacturing operation of a method of making a semiconductor device in accordance with embodiments of present disclosure.
Figure 14C:
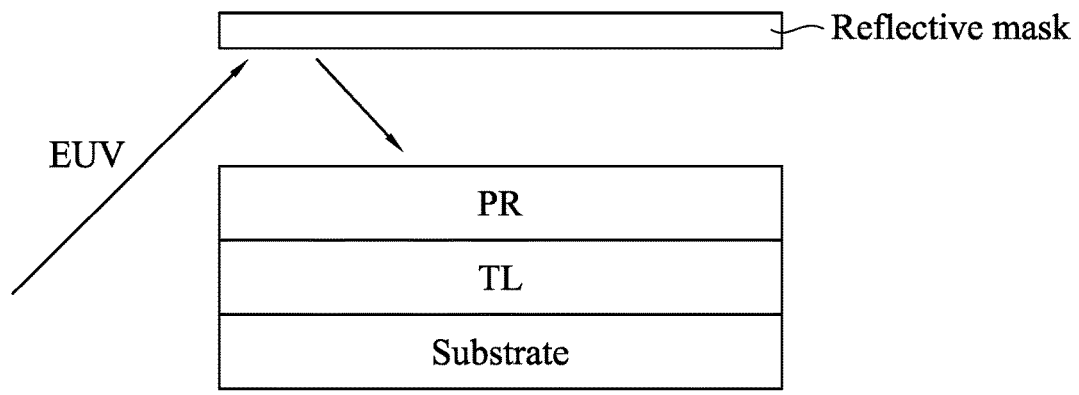

FIG. 14A shows a flowchart of a method of making a semiconductor device, and FIGS. 14B, 14C, 14D and 14E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S201 of FIG. 14A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S202 of FIG. 14A, a photo resist layer is formed over the target layer, as shown in FIG. 14B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable techniques. The coated photo resist layer may be further baked to drive out solvent in the photo resist layer. At S203 of FIG. 14A, the photoresist layer is patterned using an EUV reflective mask as set forth above, as shown in FIG. 14B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 14D:
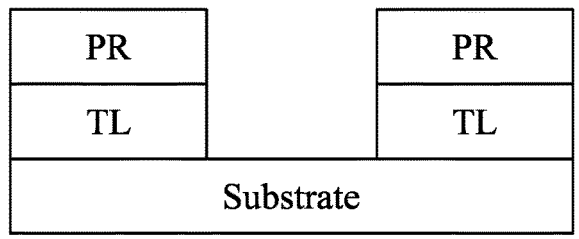
Figure 14E:
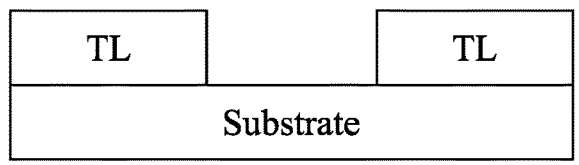

At S204 of FIG. 14A, the target layer is patterned utilizing the patterned photoresist layer as an etching mask, as shown in FIG. 14D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 14E.

In the present disclosure, since an intermediate layer as an etching stop layer is used in the middle of the reflective multilayer structure, it is possible to precisely control the depth of the embedded absorber layer. The embedded absorber layer can suppress the three dimensional effect and near-field diffraction at absorber edge.

It will be understood that not all advantages have been necessarily discussed herein, no particular advantage is required for all embodiments or examples, and other embodiments or examples may offer different advantages.

According to one aspect of the present application, a reflective mask includes a substrate, a lower reflective multilayer disposed over the substrate, an intermediate layer disposed over the lower reflective multilayer, an upper reflective multilayer disposed over the intermediate layer, a capping layer disposed over the upper reflective multilayer, and an absorber layer disposed in a trench formed in the upper reflective layers and over the intermediate layer. The intermediate layer includes a metal other than Cr, Ru, Si, Si compound and carbon. In one or more of the foregoing and following embodiments, the intermediate layer includes one or more selected from the group consisting of Ti, Ni, Co, Ir, In, Ta, Te, Al, Zr, Cu, Zn, Y, Nb, Tc, Pt, Rh, Ga, and Tl, alloys thereof, oxides thereof and nitrides thereof. In one or more of the foregoing and following embodiments, the intermediate layer includes one or more selected from the group consisting of Ir, In, Te, Y, Nb, Tc, Pt, Rh and Tl, alloys thereof, oxides thereof and nitrides thereof. In one or more of the foregoing and following embodiments, the thickness of the intermediate layer is in a range from 2 nm to 15 nm. In one or more of the foregoing and following embodiments, the capping layer is made of a same material as the intermediate layer. In one or more of the foregoing and following embodiments, an uppermost layer of the upper reflective multilayer in contact with the capping layer is a Si layer.

In accordance with another aspect of the present disclosure, a reflective mask includes a substrate, a lower reflective multilayer disposed over the substrate, an intermediate layer disposed over the lower reflective multilayer, an upper reflective multilayer disposed over the intermediate layer, a capping layer disposed over the upper reflective multilayer, and an absorber layer disposed in a trench formed in the upper reflective layers and over the intermediate layer. The absorber layer protrudes from an upper surface of the capping layer. In one or more of the foregoing and following embodiments, a protruding amount of the absorber layer is in a range from 5 nm to 30 nm. In one or more of the foregoing and following embodiments, the capping layer is made of a same material as the intermediate layer. In one or more of the foregoing and following embodiments, the capping layer includes $Ru_xM_{1-x}$, where M is one or more of Nb, Ir, Rh, Zr, Ti, B, P, V, Os, Pd, Pt or Re, x is more than zero and equal to or less than about 0.5. In one or more of the foregoing and following embodiments, the absorber layer includes one or more layers of an Ir based material, a Pt based material or a Ru based material. In one or more of the foregoing and following embodiments, the intermediate layer includes a Ru alloy. In one or more of the foregoing and following embodiments, intermediate layer includes at least one selected from the group consisting of RuNb, RuNbN, RuRh and RuRhN. In one or more of the foregoing and following embodiments, wherein the intermediate layer includes at least one selected from the group consisting of BC, BN, CN and graphene.

In accordance with another aspect of the present disclosure, a reflective mask includes a substrate, a lower reflective multilayer disposed over the substrate, an intermediate layer disposed over the lower reflective multilayer, an upper reflective multilayer disposed over the intermediate layer, a capping layer disposed over the upper reflective multilayer, and a protective layer disposed in a trench formed in the upper reflective layers and over the intermediate layer. The protective layer is transmissive to an extreme ultra violet light. In one or more of the foregoing and following embodiments, the protective layer includes at least one selected from the group consisting of silicon oxide, silicon nitride, polysilicon and silicon carbide. In one or more of the foregoing and following embodiments, the reflective mask further includes an absorber layer disposed in the trench between the protective layer and the intermediate layer. In one or more of the foregoing and following embodiments, the capping layer is made of a same material as the intermediate layer. In one or more of the foregoing and following embodiments, the capping layer and the intermediate layer are made of Ru or a Ru compound. In one or more of the foregoing and following embodiments, the intermediate layer is made of a different material than the capping layer.

In accordance with another aspect of the present disclosure, in a method of manufacturing a reflective mask, a photo resist layer is formed over a mask blank. The mask blank includes a substrate, a lower reflective multilayer disposed over the substrate, an intermediate layer disposed over the lower reflective multilayer, an upper reflective multilayer disposed over the intermediate layer, a capping layer disposed over the upper reflective multilayer, and a hard mask layer disposed over the cover layer. The photo resist layer is patterned. The hard mask layer is patterned by using the patterned photo resist layer. The capping layer and the upper reflective multiplayer layer multilayer are patterned by using the patterned hard mask layer to form a trench pattern. An absorber layer is in the trench pattern. The intermediate layer includes a metal other than Cr, Ru, Si, Si compound and carbon. In one or more of the foregoing and following embodiments, the intermediate layer includes one or more selected from the group consisting of Ti, Ni, Co, Ir, In, Ta, Te, Al, Zr, Cu, Zn, Y, Nb, Tc, Pt, Rh, Ga, and Tl, alloys thereof, oxides thereof and nitrides thereof. In one or more of the foregoing and following embodiments, the hard mask layer is removed before forming the absorber layer. In one or more of the foregoing and following embodiments, the thickness of the intermediate layer is in a range from 2 nm to 15 nm. In one or more of the foregoing and following embodiments, the capping layer is made of a same material as the intermediate layer. In one or more of the foregoing and following embodiments, an uppermost layer of the upper reflective multilayer in contact with the capping layer is a Si layer.

In accordance with another aspect of the present disclosure, in a method of manufacturing a reflective mask, a photo resist layer is formed over a mask blank. The mask blank includes a substrate, a lower reflective multilayer disposed over the substrate, an intermediate layer disposed over the lower reflective multilayer, an upper reflective multilayer disposed over the intermediate layer, a capping layer disposed over the upper reflective multilayer, and a hard mask layer disposed over the cover layer. The photo resist layer is patterned. The hard mask layer is patterned by using the patterned photo resist layer. The capping layer and the upper reflective multilayer are patterned by using the patterned hard mask layer to form a trench pattern. An absorber layer is formed in the trench pattern. After the absorber layer is formed, the hard mask layer is removed so that the absorber layer protrudes from an upper surface of the capping layer. In one or more of the foregoing and following embodiments, a protruding amount of the absorber layer is in a range from 5 nm to 30 nm. In one or more of the foregoing and following embodiments, the capping layer is made of a same material as the intermediate layer. In one or more of the foregoing and following embodiments, the capping layer includes $Ru_xM_{1-x}$, where M is one or more of Nb, Ir, Rh, Zr, Ti, B, P, V, Os, Pd, Pt or Re, x is more than zero and equal to or less than about 0.5. In one or more of the foregoing and following embodiments, the absorber layer includes one or more layers of an Ir based material, a Pt based material or a Ru based material. In one or more of the foregoing and following embodiments, the intermediate layer includes a Ru alloy. In one or more of the foregoing and following embodiments, the intermediate layer includes at least one selected from the group consisting of RuNb, RuNbN, RuRh and RuRhN. In one or more of the foregoing and following embodiments, the intermediate layer includes at least one selected from the group consisting of BC, BN, CN and graphene.

In accordance with another aspect of the present disclosure, in a method of manufacturing a reflective mask, a photo resist layer is formed over a mask blank. The mask blank includes a substrate, a lower reflective multilayer disposed over the substrate, an intermediate layer disposed over the lower reflective multilayer, an upper reflective multilayer disposed over the intermediate layer, a capping layer disposed over the upper reflective multilayer, and a hard mask layer disposed over the cover layer. The photo resist layer is patterned. The hard mask layer is patterned by using the patterned photo resist layer. The capping layer and the upper reflective multilayer are patterned by using the patterned hard mask layer to form a trench pattern. A protective layer is formed in the trench pattern. The protective layer is transmissive to an extreme ultra violet light. In one or more of the foregoing and following embodiments, the protective layer includes at least one selected from the group consisting of silicon oxide, silicon nitride, polysilicon and silicon carbide. In one or more of the foregoing and following embodiments, before the protective layer is formed, an absorber layer is formed in the trench pattern, and is recessed. The protective layer is formed over the recessed absorber layer. In one or more of the foregoing and following embodiments, the capping layer is made of a same material as the intermediate layer. In one or more of the foregoing and following embodiments, the capping layer and the intermediate layer are made of Ru or a Ru compound. In one or more of the foregoing and following embodiments, the intermediate layer is made of a different material than the capping layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reflective mask, comprising:
a substrate;
a lower reflective multilayer disposed over the substrate;
an intermediate layer disposed over the lower reflective multilayer;
an upper reflective multilayer disposed over the intermediate layer;
a capping layer disposed over the upper reflective multilayer; and
an absorber layer disposed in a trench formed through the capping layer, in the upper reflective multilayer and over the intermediate layer,
wherein an exterior surface of the reflective mask includes the absorber layer protruding from an upper surface of the capping layer,
a portion of the absorber layer in the upper reflective multilayer, a portion of the absorber layer in the capping layer, and a portion of the absorber layer protruding from the upper surface of the capping layer have a same width, and
the capping layer and the intermediate layer are made of a same material including one or more selected from the group consisting of In, Te, Cu, Zn, Tc, Ga, and Tl, alloys thereof, oxides thereof and nitrides thereof.

2. The reflective mask of claim 1, wherein the same material includes one or more selected from the group consisting of Te, Cu, Zn, Tc, Ga, and Tl, alloys thereof, oxides thereof and nitrides thereof.

3. The reflective mask of claim 1, wherein the same material includes one or more selected from the group consisting of In, Te, Tc, and Tl, alloys thereof, oxides thereof and nitrides thereof.

4. The reflective mask of claim 1, wherein the thickness of the intermediate layer is in a range from 2 nm to 15 nm.

5. The reflective mask of claim 1, wherein an uppermost layer of the upper reflective multilayer in contact with the capping layer is a Si layer.

6. The reflective mask of claim 1, wherein the thickness of the intermediate layer is in a range from 3 nm to 10 nm.

7. A method of manufacturing a reflective mask, the method comprising:
forming a photo resist layer over a mask blank, the mask blank including a substrate, a lower reflective multilayer disposed over the substrate, an intermediate layer disposed over the lower reflective multilayer, an upper reflective multilayer disposed over the intermediate layer, a capping layer disposed over the upper reflective multilayer, and a hard mask layer disposed over the capping layer;
patterning the photo resist layer;
patterning the hard mask layer by using the patterned photo resist layer;
patterning the capping layer and the upper reflective multilayer by using the patterned hard mask layer to form a trench pattern and by using the intermediate layer as an etch stop layer for the trench pattern;
forming an absorber layer in the trench pattern; and
after the absorber layer is formed, removing the hard mask layer so that the absorber layer protrudes from an upper surface of the capping layer,
wherein after the absorber layer is formed, a portion of the absorber layer in the upper reflective multilayer, a portion of the absorber layer in the capping layer, and a portion of the absorber layer protruding from the upper surface of the capping layer have a same width,
wherein the capping layer and the intermediate layer are made of a same material including one or more selected from the group consisting of In, Te, Cu, Zn, Tc, Ga, and Tl, alloys thereof, oxides thereof and nitrides thereof, and
wherein an exterior surface of the reflective mask includes the absorber layer protruding from the upper surface of the capping layer.

8. The method of claim 7, wherein a protruding amount of the absorber layer is in a range from 5 nm to 30 nm.

9. The method of claim 7, wherein the same material includes RuIn.

10. The method of claim 7, wherein the absorber layer includes one or more layers of an Ir based material, a Pt based material or a Ru based material.

11. The method of claim 7, wherein the same material includes RuTe.

12. The method of claim 11, wherein the same material includes RuTl.

13. The method of claim 7, wherein the thickness of the intermediate layer is in a range from 2 nm to 15 nm.

14. The method of claim 7, wherein both the lower reflective multilayer and the upper reflective multilayer each include alternating pairs of silicon and molybdenum layers, and a number of the alternating pairs of silicon and molybdenum layers in the upper reflective multilayer is smaller than a number of the alternating pairs of silicon and molybdenum layers in the lower reflective multilayer.

15. A method of manufacturing a reflective mask, the method comprising:
forming a photo resist layer over a mask blank, the mask blank including a substrate, a lower reflective multilayer disposed over the substrate, an intermediate layer disposed over the lower reflective multilayer, an upper reflective multilayer disposed over the intermediate layer, a capping layer disposed over the upper reflective multilayer, and a hard mask layer disposed over the capping layer;
patterning the photo resist layer;
patterning the hard mask layer by using the patterned photo resist layer;
patterning the capping layer and the upper reflective multilayer by using the patterned hard mask layer to form a trench pattern and by using the intermediate layer as an etch stop layer for the trench pattern;
forming an absorber layer in the trench pattern;
recessing the absorber layer in the trench pattern; and
forming a protective layer over the recessed absorber layer in the trench pattern,
wherein after the protective layer is formed, the absorber layer and the protective layer have a same width in the trench,
wherein the protective layer is transmissive to extreme ultra violet light,
wherein the capping layer and the intermediate layer are made of a same material including one or more selected from the group consisting of In, Te, Cu, Zn, Tc, Ga, and Tl, alloys thereof, oxides thereof and nitrides thereof, and wherein an exterior surface of the reflective mask comprises a pattern including the capping layer and the protective layer.

16. The method of claim 15, wherein the protective layer includes at least one selected from the group consisting of silicon oxide, silicon nitride, polysilicon and silicon carbide.

17. The method of claim 15, wherein the thickness of the intermediate layer is in a range from 2 nm to 15 nm.

18. The method of claim 15, wherein the same material includes one or more selected from the group consisting of In, Te, Tc, Ga, and Tl, alloys thereof, and nitrides thereof.

19. The method of claim 15, wherein the same material further includes Ru.

20. The method of claim 19, wherein the same material includes one or more selected from the group consisting of In, Tc, Ga, and Tl, alloys thereof, oxides thereof and nitrides thereof.

* * * * *